(12) United States Patent
Rimkus et al.

(10) Patent No.: US 12,414,249 B2
(45) Date of Patent: Sep. 9, 2025

(54) ELECTRICAL LEAD-THROUGH AND ELECTRONICS HOUSING

(71) Applicant: Endress+Hauser Flowtec AG, Reinach (CH)

(72) Inventors: Philipp Rimkus, Lörrach (DE); Björn Larsson, Birsfelden (CH); Daniel Kessler, Frenkendorf (CH)

(73) Assignee: Endress+Hauser Flowtec AG, Reinach (CH)

( * ) Notice: Subject to any disclaimer, the term of this patent is extended or adjusted under 35 U.S.C. 154(b) by 0 days.

(21) Appl. No.: 18/689,173

(22) PCT Filed: Aug. 5, 2022

(86) PCT No.: PCT/EP2022/072052
§ 371 (c)(1),
(2) Date: Mar. 5, 2024

(87) PCT Pub. No.: WO2023/030823
PCT Pub. Date: Mar. 9, 2023

(65) Prior Publication Data
US 2024/0389252 A1    Nov. 21, 2024

(30) Foreign Application Priority Data

Sep. 6, 2021 (DE) .................... 10 2021 122 931.6

(51) Int. Cl.
*H05K 5/02* (2006.01)
(52) U.S. Cl.
CPC ................. *H05K 5/0247* (2013.01)

(58) Field of Classification Search
CPC ..................................... H05K 5/0247
See application file for complete search history.

(56) References Cited

U.S. PATENT DOCUMENTS

| 2,361,215 A | 10/1944 | Lamberger et al. |
| 3,744,008 A | 7/1973 | Castellani |
| 2008/0020634 A1 | 1/2008 | Taniguchi et al. |

(Continued)

FOREIGN PATENT DOCUMENTS

| CN | 110445085 A | 11/2019 |
| EP | 1022834 A1 | 7/2000 |

(Continued)

*Primary Examiner* — Hung V Ngo
(74) *Attorney, Agent, or Firm* — Mark A. Logan; Endress+Hauser (USA) Holding, Inc.

(57) ABSTRACT

An electrical lead-through for an electronics housing, comprises a first stop element with at least one first through-hole, a second stop element with at least one second through-hole, an elastic element which extends between the first stop element and the second stop element along a first axis, and at least one electrical contact element with a first end and a second end lying opposite the first end. The first end of the contact element is movably arranged in the first through-hole and the second end is movably arranged in the second through-hole. The elastic element is suitable for deforming when the first stop element and the second stop element are moved relative to each other, and the first stop element and the second stop element are each suitable for being fixed to the electronics housing.

9 Claims, 2 Drawing Sheets

(56) References Cited

U.S. PATENT DOCUMENTS

| | | | |
|---|---|---|---|
| 2010/0107398 A1* | 5/2010 | Girard | H02G 15/046 |
| | | | 29/525 |
| 2018/0041018 A1* | 2/2018 | Thompson | H05K 5/069 |
| 2018/0301883 A1* | 10/2018 | Nowastowski-Stock | ...... |
| | | | H05K 5/0247 |
| 2019/0097403 A1* | 3/2019 | Rana | H02G 3/088 |
| 2021/0378120 A1* | 12/2021 | Park | H05K 5/069 |

FOREIGN PATENT DOCUMENTS

| | | |
|---|---|---|
| EP | 1883147 A2 | 1/2008 |
| EP | 2862250 B1 | 7/2016 |
| WO | 2019101268 A1 | 5/2019 |

* cited by examiner

ELECTRICAL LEAD-THROUGH AND ELECTRONICS HOUSING

CROSS-REFERENCE TO RELATED APPLICATIONS

The present application is related to and claims the priority benefit of DPMA Patent Application No. 10 2021 122 931.6, filed on Sep. 6, 2021, and International Patent Application No. PCT/EP2022/072052, filed Aug. 5, 2022, the entire contents of which are incorporated herein by reference.

TECHNICAL FIELD

The invention relates to an electrical lead-through and to an electronics housing.

BACKGROUND

Electronics housings are used in various environments in the industry. If an electronics housing is to be used in an environment that is exposed to explosion hazards, the electronics housing must have a pressure-resistant casing in order to prevent a flame or a spark from escaping from the electronics housing.

Pressure-resistant casings are particularly difficult to realize in the region of the electrical lead-through on the housing, i.e., at the electrical interface with the electronics arranged in the housing. So far, electrical lead-throughs have been cast in a complicated manner, which is associated with expensive materials and a long drying time. The production costs and the production time of an electronics housing are thus increased.

SUMMARY

It is therefore an object of the invention to provide an electrical lead-through which optimizes the manufacturing costs and the manufacturing time of an electronics housing.

This object is achieved by the electrical lead-through for an electronics housing according to the present disclosure.

The electrical lead-through according to the invention comprises:
- a first stop element with at least one first through-hole,
- a second stop element with at least one second through-hole,
- an elastic element which extends between the first stop element and the second stop-element along a first axis,
- at least one electrical contact element with a first end and a second end lying opposite the first end. The first end is movably arranged in the first through-hole and/or the second end is movably arranged in the second through-hole. The elastic element is suitable for deforming when the first stop element and the second stop element are moved relative to each other. The first stop element and the second stop element are each suitable for being fixed to the electronics housing.

The electrical lead-through according to the invention allows for providing an electrical lead-through for an electronics housing which, even in the event of high temperature fluctuations causing a contraction of the material, reliably seals the electronics housing towards the outside at its electrical interface. Moreover, the electrical lead-through according to the invention allows for a simple and convenient installation in an electronics housing.

According to one embodiment of the invention, the first through-hole of the first stop element has a taper with a first hole diameter, and the first end of the electrical contact element has a taper with a first diameter. The first hole diameter and the first diameter are the same, and/or the second through-hole of the second stop element has a taper with a second hole diameter, and the second end of the electrical contact element has a taper with a second diameter. The second hole diameter and the second diameter are the same.

According to one embodiment of the invention, the first stop element extends transversely to the first axis and the second stop element extends transversely to the first axis.

According to one embodiment of the invention, the second stop element comprises a first fastening unit with an adhesive surface, a welding surface, a thread and screw, a groove and a snap ring, or a hole and a rivet.

According to one embodiment of the invention, the elastic element extends longitudinally to the first axis and has a cross-sectional shape that is at least partially conical.

According to one embodiment of the invention, the elastic element is made from elastomer.

The above object is further achieved by an electronics housing for enclosing an electronic unit.

The electronics housing according to the invention comprises:
- an electrical lead-through according to the invention,
- a housing body.

The housing body has a connection channel for receiving the electrical lead-through. The connection channel has an inner wall which is partially complementary to an outer wall of the elastic element, so that the connection channel is sealed by the electrical lead-through when the electrical lead-through is arranged in the connection channel. The connection channel has a cavity which is arranged such that, when the first stop element and the second stop element are moved relative to each other, the elastic element can be deformed into the cavity. The connection channel has a first fastening region which is suitable for being fixed to the first stop element, and the housing body has a second fastening region which is suitable for being fixed to the second stop element, so that, when the first fastening region is fixed to the first stop element and the second fastening region is fixed to the second stop element, the elastic element is deformed into the cavity.

According to one embodiment of the invention, the second fastening region comprises an adhesive surface, a welding surface, a thread, a groove for a snap ring, or a hole for a rivet, and the second stop element comprises a first fastening unit with an adhesive surface, a welding surface, a thread and screw, a groove and a snap ring, or a hole and a rivet.

According to one embodiment of the invention, the connection channel extends along a second axis, and the first fastening region and the second fastening region are spaced apart along the second axis by a first distance. The first stop element and the second stop element of the electrical lead-through are spaced apart along the first axis by a second distance. The first distance is smaller than the second distance.

According to one embodiment of the invention, the electrical contact element has a first stop at the taper at its first end, and the first stop element has a second stop at the first through-hole, and/or the electrical contact element has a third stop at the taper at its second end, and the second stop element has a fourth stop at the second through-hole, so that, when the first fastening region is fixed to the first stop element and when the second fastening region is fixed to the second stop element, the first stop is in contact with the second stop and/or the third stop is in contact with the fourth stop.

BRIEF DESCRIPTION OF THE DRAWINGS

The present disclosure is explained in more detail on the basis of the following description of the figures. In the figures.

DETAILED DESCRIPTION

Figure 1:
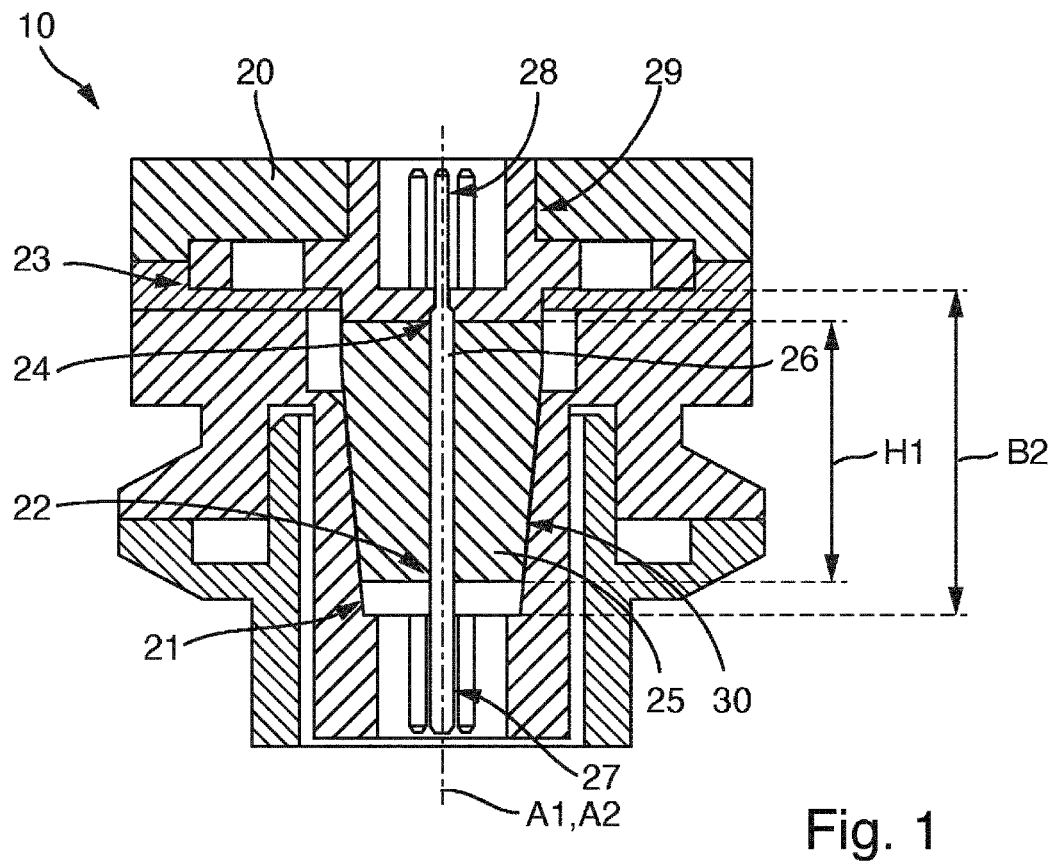
FIG. 1 shows a schematic sectional drawing of an electrical lead-through according to the present disclosure which is installed in an electronics housing.

FIG. 1 shows an electronics housing 10 according to the invention with a housing body 11 and an electrical lead-through 20.

The electrical lead-through 20 comprises a first stop element 21, a second stop element 23, an elastic element 25 and an electrical contact element 26.

The first stop element 21 has at least one first through-hole 22. The first through-hole 22 is suitable for receiving an electrical contact element 26. In the embodiments shown in FIGS. 1 to 4, the first stop element 21 has three through-holes in order to receive an electrical contact element in each through-hole. The first stop element 21 is suitable for being fixed to the electronics housing 10.

The second stop element 23 has at least one second through-hole 24. The second through-hole 24 is suitable for receiving an electrical contact element 26. In the embodiments shown in FIGS. 1 to 4, the second stop element 23 has three through-holes in order to receive an electrical contact element in each through-hole. The second stop element 23 is suitable for being fixed to the electronics housing 10. The second stop element 23 has a first fastening unit 29. The first fastening unit 29 is, for example, an adhesive surface, a welding surface, a thread with a screw, a groove with a snap ring or a hole with a rivet.

The first stop element 21 and the second stop element 23 are made of an electrically insulating material, for example plastic. The first stop element 21 preferably extends transversely to the first axis A1 and the second stop element 23 preferably extends transversely to the first axis A1.

The elastic element 25 is arranged such that it extends between the first stop element 21 and the second stop element 23 along a first axis A1. The first stop element 21 and the second stop element 23 thus delimit the elastic element 25. The elastic element 25 has a first height H1 along the first axis A1. The elastic element 25 has an outer wall 30. The elastic element 25 is suitable for deforming when the first stop element 21 and the second stop element 23 are moved relative to each other. The elastic element 25 has at least one through-opening in which the at least one electrical contact element 26 is located. The elastic element 25 is arranged such as to be movable relative to the electrical contact element 26.

The elastic element 25 preferably has an at least partially conical cross-sectional shape longitudinally to the first axis A1. The conical cross-sectional shape allows for safe and comfortable installation of the electrical lead-through 20 in the electronics housing 10. Moreover, if the tip of the cone is directed towards the outside, a conical cross-sectional shape makes it possible for the cone to become wedged in the connection channel 12, i.e., to seal the connection channel 12, if there is excess pressure in the electronics housing 10. Of course, the elastic element 25 can also have other shapes, such as a cylindrical shape, for example.

For example, the elastic element 25 is made of elastomer or comprises an elastomer. Of course, the elastic element 25 can also be made of other elastic materials, provided that the elasticity of the elastic element 25 enables a deformation of the elastic element 25 such that a bead can be formed when the first stop element 21 and the second stop element 23 are pressed together (see FIG. 2).

The electrical contact element 26 has a first end 27 and a second end 28 opposite the first end 27. The first end 27 is arranged in the first through-hole 22 and the second end 28 is arranged in the second through-hole 24. The electrical contact element 26 is made of an electrically conductive material. For example, the electrical contact element 26 is made of copper, silver or gold or has a coating of silver, gold or platinum.

Figure 3:
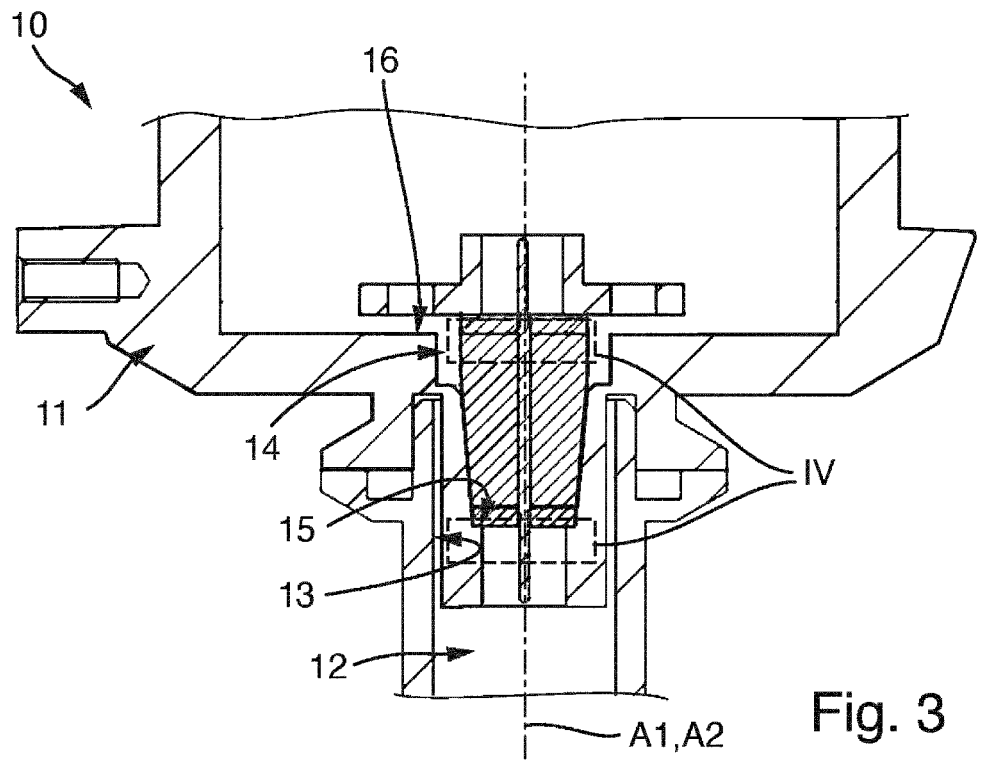
FIG. 3 shows a sectional drawing of the electrical lead-through shown in FIG. 1 with an electronics housing.
Figure 4:
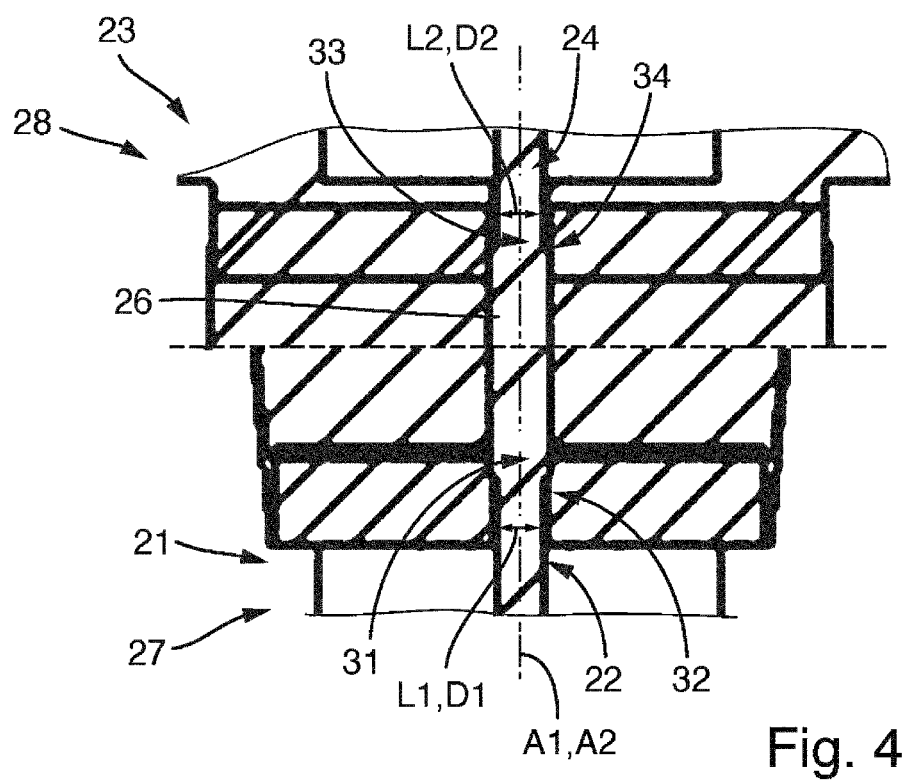
FIG. 4 shows an enlarged representation of two details of FIG. 3.

FIG. 4 shows two marked details from FIG. 3 in an enlarged representation. As shown in FIG. 4, the first through-hole 22 of the first stop element 21 has a taper with a first hole diameter L1, and the first end 27 of the electrical contact element 26 has a taper with a first diameter D1. The first hole diameter L1 and the first diameter D1 are substantially the same. Here, "the same" shall be understood to mean that the electrical contact element can be inserted just barely into the stop element. Alternatively or complementarily, the second through-hole 24 of the second stop element 23 has a taper with a second hole diameter L2, and the second end 28 of the electrical contact element 26 has a taper with a second diameter D2. The second hole diameter L2 and the second diameter D2 are the same.

The first end 27 of the electrical contact element 26 is movably arranged in the first through-hole 22 along the first axis A1 and/or the second end 28 is movably arranged in the second through-hole 24 along the first axis A1. As a result, the electrical contact element 26 facilitates a compression of the first stop element 21 and the second stop element 23.

Figure 2:
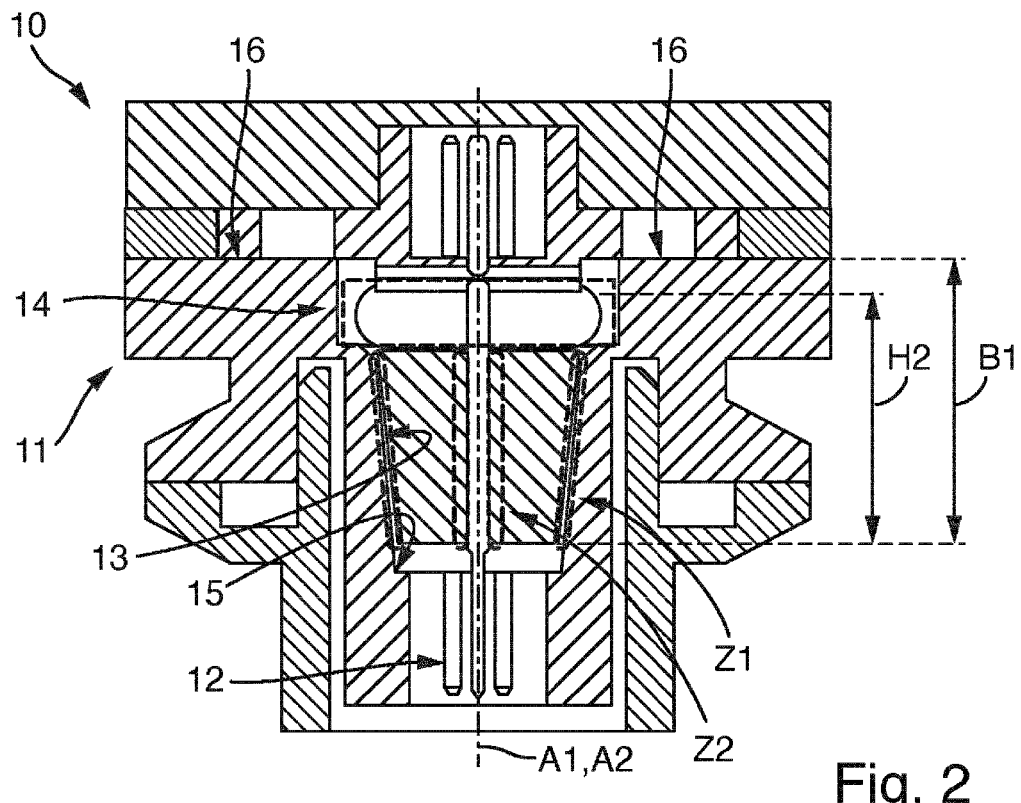
FIG. 2 shows the electrical lead-through of FIG. 1, which is fastened in the electronics housing.

FIG. 1 to FIG. 3 show the housing body 11, which has a connection channel 12 for receiving the electrical lead-through 20. The connection channel 12 has an inner wall 13 which is partially complementary to the outer wall 30 of the elastic element 25.

The connection channel 12 has a cavity 14 which is arranged such that, when the first stop element 21 and the second stop element 23 are moved relative to each other, the elastic element 25 can be deformed into the cavity 14. The cavity 14 preferably extends around the first axis A1, so that the cavity 14 extends concentrically around the elastic element 25 when the latter is arranged in the connection channel 12.

The connection channel 12 has a first fastening region 15 which is suitable for being fixed to the first stop element 21. The first fastening region 15 is preferably a shoulder which fixes the first stop element 21, so that the first stop element 21 is fixed in a direction along the first axis A1. In other words, the first stop element 21 is thus held in the connection channel 12. An exchange of the electrical lead-through 20 is thus easily possible. As an alternative to a shoulder extending substantially orthogonally to the longitudinal axis A1, i.e., forming a taper of the connection channel 12 (see FIGS. 1-4), the shoulder can also extend obliquely to the longitudinal axis A1, i.e., can have a conical shape. A conical shape of the shoulder allows the first stop element 21 and the shoulder to be wedged.

According to an alternative embodiment, the first fastening region 15 is glued, welded, for example ultrasonically welded, or connected to the connection channel 12 by means of a mechanical unit, for example a clamping ring.

The housing body 11 has a second fastening region 16 which is suitable for being connected to the second stop element 23, so that, when the first fastening region 15 is connected to the first stop element 21 and the second fastening region 16 is connected to the second stop element 23, the elastic element 25 is deformed into the cavity 14. The second fastening region 16 comprises an adhesive surface, a welding surface, a thread, a groove for a snap ring or a hole for a rivet.

The connection channel 12 extends along a second axis A2. Both the first fastening region 15 and the second fastening region 16 are spaced apart along the second axis A2 by a first distance B1. The first stop element 21 and the second stop element 23 of the electrical lead-through 20 are spaced apart along the first axis A1 by a second distance B2. The first distance B1 is smaller than the second distance B2.

As can be seen in FIG. 4, the electrical contact element 26 has a first stop 31 at the taper at its first end 27, and the first stop element 21 has a second stop 32 at the first through-hole 22. Alternatively or complementary, the electrical contact element 26 has a third stop 33 at the taper at its second end 28, and the second stop element 23 has a fourth stop 34 at the second through-hole 24. As a result, when the first fastening region 15 is fixed to the first stop element 21 and when the second fastening region 16 is fixed to the second stop element 23, the first stop 31 is in contact with the second stop 32 and/or the third stop 33 is in contact with the fourth stop 34.

Hereinafter, the installation of the electronics housing 10, i.e., installation of the electrical lead-through 20 in the housing body 11, is described.

First, the electrical lead-through 20 is installed in the connection channel 12 of the housing body 11 and the first stop element 21 is fixed to the first fastening region 15. Fixing means, for example, pressing, gluing or welding the first stop element 21 to the first fastening region 15, for example a shoulder. Of course, the first stop element 21 can also be fixed to the first fastening region 15 in some other way, for example by means of a clamping ring.

The second stop element 23 is then pressed along the first axis A1 in the direction of the first stop element 21, so that the elastic element 25 is deformed and forms a bead which extends into the cavity 14 of the connection channel 12. In this position, the elastic element 25 has a second height H2, which is lower than the first height H1 (see FIG. 2).

Next, the second stop element 23 is fixed to the second fastening region 16 of the housing body 11. Fixing means, for example, gluing, screwing, riveting or welding the second stop element 23 to the second fastening region 16. Of course, the second stop element 23 can also be fixed to the second fastening region 16 in some other way, for example by means of a clamping ring.

Thanks to the bead formation on the elastic element 25, the electrical lead-through 20 allows optimal sealing of the connection channel 12 even in the event of temperature fluctuations. If, for example, the elastic element 25 contracts at low temperatures, this means that the bead is somewhat reduced but a first gap zone Z1 and a second gap zone Z2 is still kept minimal or avoided (see FIG. 2).

The invention claimed is:

1. An electrical lead-through for an electronics housing, comprising:
   a first stop element with a first through-hole;
   a second stop element with a second through-hole;
   an elastic element which extends between the first stop element and the second stop element along a first axis; and
   at least one electrical contact element with a first end and a second end lying opposite the first end,
   wherein the first end of the electrical contact element is movably arranged in the first through-hole and/or the second end of the electrical contact element is movably arranged in the second through-hole,
   wherein the elastic element is suitable for deforming when the first stop element and the second stop element are moved relative to each other,
   wherein the first stop element and the second stop element are each suitable for being fixed to the electronics housing, and
   wherein the first through-hole of the first stop element has a taper with a first hole diameter, the first end of the electrical contact element has a taper with a first diameter, and the first hole diameter and the first diameter are the same, and/or wherein the second through-hole of the second stop element has a taper with a second hole diameter, the second end of the electrical contact element has a taper with a second diameter, and the second hole diameter and the second diameter are the same.

2. The electrical lead-through according to claim 1, wherein the first stop element extends transversely to the first axis and the second stop element extends transversely to the first axis.

3. The electrical lead-through according to claim 1, wherein the second stop element includes a first fastening unit with an adhesive surface, a welding surface, a thread and screw, a groove and a snap ring, or a hole and a rivet.

4. The electrical lead-through according to claim 1, wherein the elastic element extends longitudinally to the first axis and has a cross-sectional shape that is at least partially conical.

5. The electrical lead-through according to claim 1, wherein the elastic element is made of elastomer.

6. An electronics housing for enclosing an electronic unit, comprising:
   an electrical lead-through, including:
      a first stop element with a first through-hole;
      a second stop element with a second through-hole;
      an elastic element which extends between the first stop element and the second stop element along a first axis; and
      at least one electrical contact element with a first end and a second end lying opposite the first end,
      wherein the first end of the electrical contact element is movably arranged in the first through-hole and/or the second end of the electrical contact element is movably arranged in the second through-hole,
      wherein the elastic element is suitable for deforming when the first stop element and the second stop element are moved relative to each other, and
      wherein the first stop element and the second stop element are each suitable for being fixed to the electronics housing; and
   a housing body having a connection channel for receiving the electrical lead-through,
   wherein the connection channel has an inner wall which is partially complementary to an outer wall of the elastic element so that the connection channel is sealed by the electrical lead-through when the electrical lead-through is arranged in the connection channel, wherein the connection channel has a cavity which is arranged such that, when the first stop element and the second stop element are moved relative to each other, the elastic element can be deformed into the cavity, and wherein the connection channel has a first fastening region which is suitable for being fixed to the first stop element, and the housing body has a second fastening region which is suitable for being fixed to the second stop element so that, when the first fastening region is fixed to the first stop element and the second fastening region is fixed to the second stop element, the elastic element is deformed into the cavity.

7. The electronics housing according to claim 6, wherein the second fastening region includes an adhesive surface, a welding surface, a thread, a groove for a snap ring, or a hole for a rivet, and the second stop element comprises a first fastening unit with an adhesive surface, a welding surface, a thread and screw, a groove and a snap ring, or a hole and a rivet.

8. The electronics housing according to claim 7, wherein the connection channel extends along a second axis, and the first fastening region and the second fastening region are spaced apart along the second axis by a first distance, and wherein the first stop element and the second stop element of the electrical lead-through are spaced apart along the first axis by a second distance that is larger than the first distance is smaller than the second distance.

9. The electronics housing according to any one of claim 8, wherein the electrical contact element has a first stop at the taper at its first end, and the first stop element has a second stop at the first through-hole, and/or the electrical contact element has a third stop at the taper at its second end, and the second stop element has a fourth stop at the second through-hole so that, when the first fastening region is fixed to the first stop element and when the second fastening region is fixed to the second stop element, the first stop is in contact with the second stop and/or the third stop is in contact with the fourth stop.

* * * * *